（12） United States Patent
Kodama (10) Patent No.: US 8,526,901 B2
(45) Date of Patent: Sep. 3, 2013

(54) BAND ADJUSTMENT DEVICE OF POLYPHASE FILTER AND BAND ADJUSTMENT METHOD OF POLYPHASE FILTER

(75) Inventor: Hiroshi Kodama, Tokyo (JP)

(73) Assignee: NEC Corporation, Tokyo (JP)

( * ) Notice: Subject to any disclaimer, the term of this patent is extended or adjusted under 35 U.S.C. 154(b) by 370 days.

(21) Appl. No.: 12/993,431

(22) PCT Filed: May 19, 2009

(86) PCT No.: PCT/JP2009/059188
§ 371 (c)(1),
(2), (4) Date: Nov. 18, 2010

(87) PCT Pub. No.: WO2009/142201
PCT Pub. Date: Nov. 26, 2009

(65) Prior Publication Data
US 2011/0068843 A1 Mar. 24, 2011

(30) Foreign Application Priority Data
May 19, 2008 (JP) .................. 2008-130676

(51) Int. Cl.
*H04B 1/10* (2006.01)
*H04B 7/00* (2006.01)
(52) U.S. Cl.
USPC .......................... 455/266; 455/307

(58) Field of Classification Search
USPC .................. 455/226.1, 266, 307
See application file for complete search history.

(56) References Cited

U.S. PATENT DOCUMENTS
2007/0111691 A1 * 5/2007 Hanke et al. ............... 455/239.1

FOREIGN PATENT DOCUMENTS
| JP | 05-160643 A | 6/1993 |
| JP | 08-130416 A | 5/1996 |
| JP | 2006-339700 A | 12/2006 |
| WO | 2005/122394 A | 12/2005 |

OTHER PUBLICATIONS

Sung Ho Wang, et al., "A 5-GHz Band I/Q Clock Generator using a Self-Calibration Technique", Solid-State Circuits Conference, ESSCIRC 2002, Proceedings of the 28th European, Sep. 26, 2002, pp. 807-810.

* cited by examiner

*Primary Examiner* — Nguyen Vo
(74) *Attorney, Agent, or Firm* — Sughrue Mion, PLLC (57) ABSTRACT

Provided is a base adjustment device and method of a polyphase filter that can reduce an area and power consumption, and operate at a high speed. The band adjustment device of the polyphase filter according to the present invention includes a voltage-controlled oscillator (VCO), a polyphase filter that inputs an output from the VCO, a mixer that receives an output from the polyphase filter, an envelope detection circuit (envelope detector) that inputs an output from the mixer, and a band control signal generation circuit that inputs an output from the envelope detector.

27 Claims, 12 Drawing Sheets

BAND ADJUSTMENT DEVICE OF POLYPHASE FILTER AND BAND ADJUSTMENT METHOD OF POLYPHASE FILTER

TECHNICAL FIELD

The present invention relates to a band adjustment device of a polyphase filter, and a band adjustment method of a polyphase filter.

BACKGROUND ART

An example of a band adjustment method of a polyphase filter is shown in FIG. 7 on the page 810 of "European solid-state circuits (IEEE EUROPEAN SOLID STATES CIRCUITS, 2002)". This example is used in order to accurately adjust to 90 degrees a phase difference between output IQ signals, which are output differential signals from a Voltage Controlled Oscillator (VCO) converted by a polyphase filter. Note that patent document 1 discloses a configuration to input an output signal from a VCO into a polyphase filter.

Figure 16:
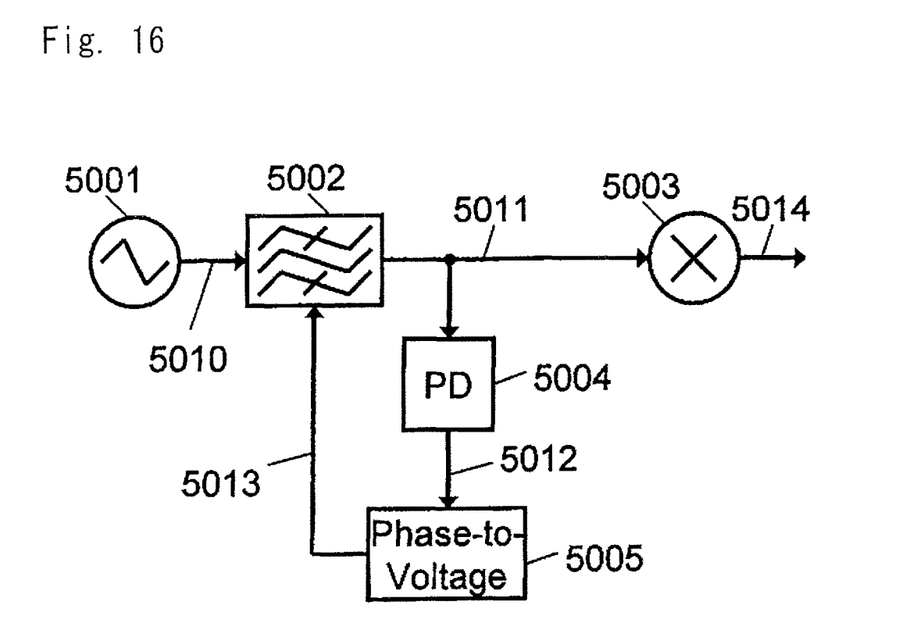
FIG. 16 is a block diagram illustrating a configuration of a band adjustment device of a polyphase filter disclosed in patent document 1.

FIG. 16 is a view illustrating a circuit configuration which is an example of a band adjustment device of a polyphase filter. The band adjustment device of the polyphase filter shown in FIG. 16 is composed of a VCO 5001, a polyphase filter 5002, a mixer 5003, a phase comparator 5004, and a phase-to-controlled voltage converter 5005. In such a configuration, firstly an output signal 5010 from the VCO is converted from a differential signal to an IQ signal 5011 by the polyphase filter. Next, this IQ signal is input to an LO port of the mixer and also to the phase comparator, and a phase error from 90 degrees is detected. Then, an output signal 5012 from this phase comparator is converted into a controlled voltage by the phase-to-controlled voltage converter, and a band of the polyphase filter is adjusted so as to reduce the phase error by the controlled voltage. At this time, the number of stages of the polyphase filter is one. By repeating the loop operation by this polyphase filter, the phase comparator, and the phase-to-control voltage converter for several times, the IQ signal with a small phase error is generated.

[Patent Document 1]
Japanese Unexamined Patent Application Publication No. 2006-339700

DISCLOSURE OF INVENTION

Technical Problem

However, there are some problems in the abovementioned band adjustment device of the polyphase filter of FIG. 16. A first problem is that it is difficult to reduce an area and power consumption. The cause to generate this problem is that the phase comparator and the phase-to-controlled voltage converter are used, which are unnecessary for normal modulation and demodulation operations. A second problem is that it is difficult to speed up an operating frequency. The cause to generate this problem is that the load of the phase comparator is added to an output unit of the polyphase filter. A third problem is that it is difficult to increase the bandwidth of a signal. The cause to generate this problem is that a variable range of a required element value is wide by using the one-stage polyphase filter.

The present invention is made in light of the above-mentioned circumstances, and an object thereof is to provide a band adjustment device of a polyphase filter and a band adjustment method of the polyphase filter for a wireless transceiver that can reduce an area, power consumption, and operate at a high speed.

Technical Solution

In order to achieve such purpose, a band adjustment device of a polyphase filter according to the present invention includes a voltage controlled oscillator that generates a clock signal, a polyphase filter that receives the clock signal output from the voltage controlled oscillator and outputs a four-phase signal, a mixer that receives the four-phase signal output from the polyphase filter and an external test signal, an envelope detection circuit that receives a signal output from the mixer, an envelope detection circuit that receives an signal output from the mixer, and a band control signal generation circuit that receives a signal output from the envelope detection circuit and generates a band control signal for controlling a band of the polyphase filter.

A band adjustment method of a polyphase filer according to the present invention that includes a step performed by a voltage controlled oscillator of generating a clock signal, a step performed by a polyphase filter of receiving the clock signal output from the voltage controlled oscillator and outputting a four-phase signal, a step performed by a mixer of receiving the four-phase signal output from the polyphase filer and an external test signal, a step performed by an envelope detection circuit of receiving a signal output from the mixer, and a step performed by a band control signal generation circuit of receiving a signal output from the envelope detection circuit and generating a band control signal that controls a band of the polyphase filter.

Advantageous Effects

According to the present invention, it is possible to achieve band adjustment of a polyphase filter that can reduce an area, power consumption, and operate at a high speed.

BEST MODE FOR CARRYING OUT THE INVENTION

Hereinafter, the best mode for carrying out the present invention is explained in detail with reference to the attached drawings.

First Embodiment

Figure 1:
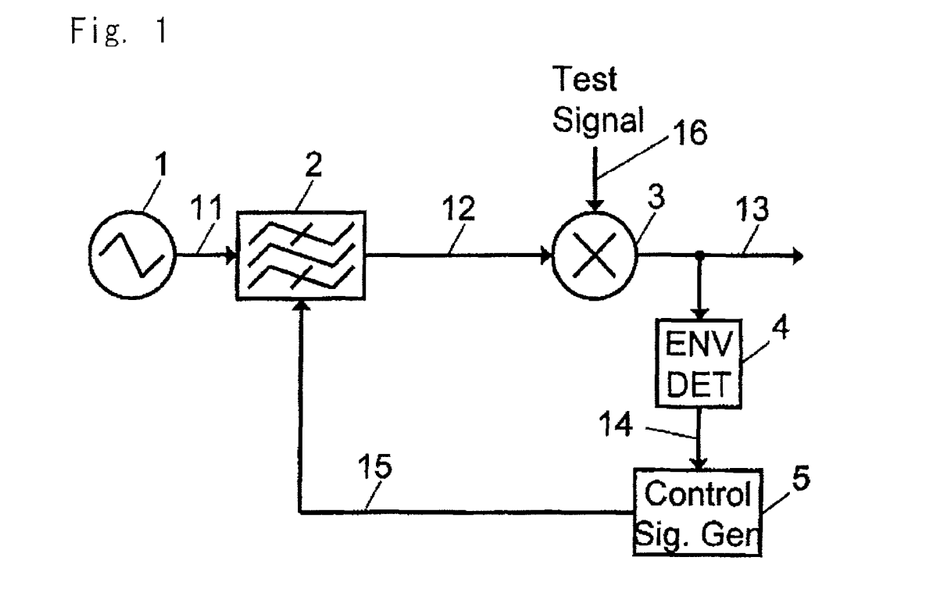
FIG. 1 is a block diagram illustrating a configuration of a band adjustment device of a polyphase filter according to a first embodiment of the present invention.

FIG. 1 is a block diagram illustrating a configuration of a band adjustment device of a polyphase filter according to a first embodiment of the present invention. The band adjustment device of the polyphase filter of this embodiment includes a voltage controlled oscillator (VCO) 1 that generates a differential clock signal, a polyphase filter 2 that receives the output from the VCO and generates an IQ signal (four-phase signal), a mixer 3 that receives the output from the polyphase filter and a test signal, an envelope detection circuit (envelope detector) 4 that receives the output from the mixer, and a band control signal generation circuit 5 that receives the output from the envelope detector. Note that in this specification, "output from OO" indicates "signal (data) output from OO". For example, "output from a VCO" indicates "a signal output from a VCO".

Next, specific first, second, and third circuits of the polyphase filter are described in detail with reference to the drawings.

Figure 10:
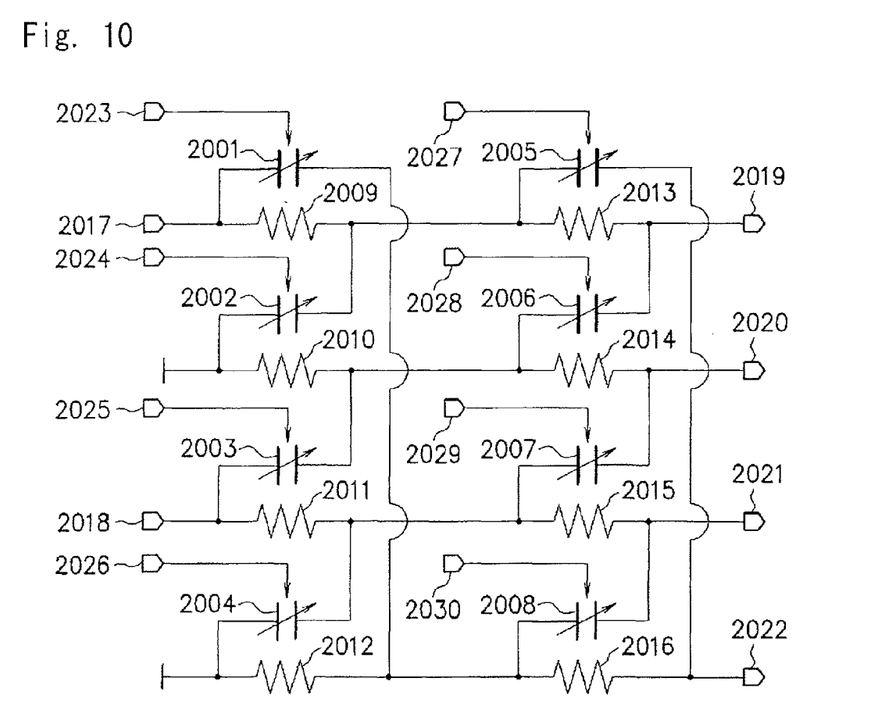
FIG. 10 is a view illustrating a specific first circuit of the polyphase filter according to the first embodiment of the present invention.

As illustrated in FIG. 10, a first polyphase filter is composed of resistive elements 2009 to 2016 and variable capacitive elements 2001 to 2008. Capacitance values of these variable capacitive elements are controlled by signals from control terminals 2023 to 2030. A differential output signal from the VCO is respectively input to input terminals 2017 and 2018. Note that this circuit is a two-stage configuration, however it may be a multiple-stage configuration by connecting the configuration in series.

Figure 11:
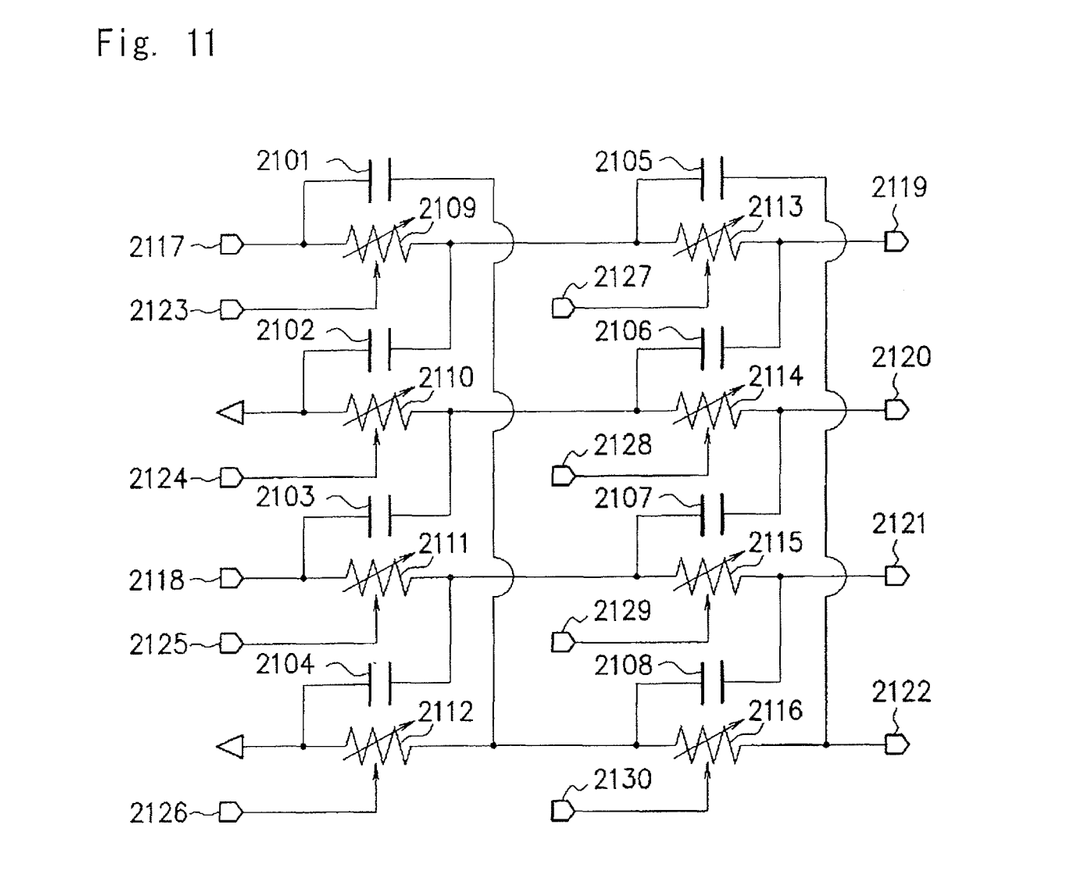
FIG. 11 is a view illustrating a specific second circuit of the polyphase filter according to the first embodiment of the present invention.

Further, as shown in FIG. 11, a second polyphase filter is composed of variable resistive elements 2109 to 2116 and capacitive elements 2101 to 2108. Resistance values of these variable resistive elements are controlled by signals from control terminals 2123 to 2130. The differential output signal from the VCO is respectively input to input terminals 2117 and 2118.

Figure 12:
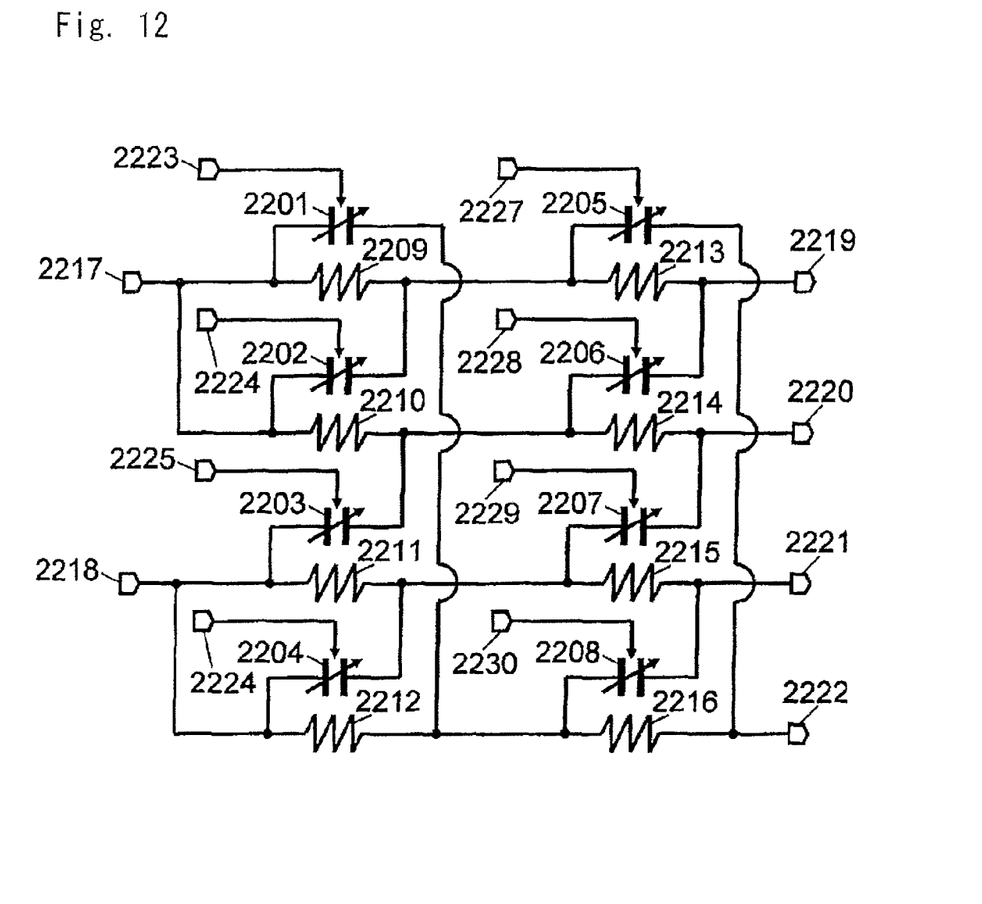
FIG. 12 is a view illustrating a specific third circuit of the polyphase filter according to the first embodiment of the present invention.

Furthermore, as shown in FIG. 12, a third polyphase filter is composed of resistive elements 2209 to 2216 and variable capacitive elements 2201 to 2208. Capacitance values of these variable capacitive elements are controlled by signals from control terminals 2223 to 2230. The differential output signal from the VCO is respectively input to input terminals 2217 and 2218. There is no need for AC ground unlike the first polyphase filter shown in FIG. 10.

Next, an operation of the band adjustment device of the polyphase filter (band adjustment method of the polyphase filter) according to the first embodiment of the present invention is explained in detail with reference to the drawing.

When a test signal is input to the mixer, an amount of deviation of a phase and amplitude between IQ signals output from the polyphase filter can be evaluated by envelope detector output. The element value composing the polyphase filter is changed by the control signal generated based on the amount of deviation, and thereby adjusting the band of the polyphase filter. By repeating this operation, the band of the polyphase filter is adjusted to an optimal value while an optimal control signal is determined.

As explained above, according to this embodiment, the following effects are obtained.

A first effect is to able to achieve band adjustment of the polyphase filter with reduced area and low power consumption. The reason that the first effect is achieved is to be able to share the envelope detector used for DC offset cancel of the mixer, instead of the phase comparator in a related art.

A second effect is to be able to achieve the band adjustment of the polyphase filter that can operate at a high speed. The reason that the second effect is achieved is that the load of the phase comparator in the related art is eliminated.

Accordingly, according to this embodiment, since the phase comparator becomes unnecessary, it is possible to provide a device and a method of band adjustment of the polyphase filter that achieve reduced area, low power consumption, and high-speed operation.

Second Embodiment

Figure 2:
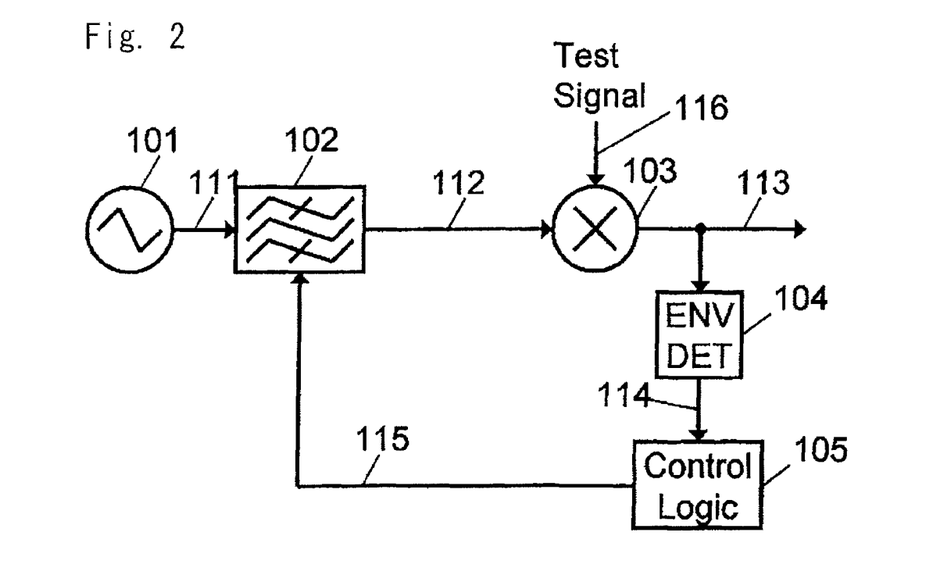
FIG. 2 is a block diagram illustrating a configuration of a band adjustment device of a polyphase filter according to a second embodiment of the present invention.

FIG. 2 is a block diagram showing a configuration of a band adjustment device of a polyphase filter according to a second embodiment of the present invention. The band adjustment device of the polyphase filter of this embodiment includes a voltage controlled oscillator (VCO) 101 that generates a differential clock signal, a polyphase filter 102 that receives the output from the VCO and generates an IQ signal, a mixer 103 that receives the output from the polyphase filter and a test signal, an envelope detection circuit (envelope detector) 104 that receives a mixer output, and a band control digital signal generation circuit 105 that receives the output from the envelope detector.

Figure 13:
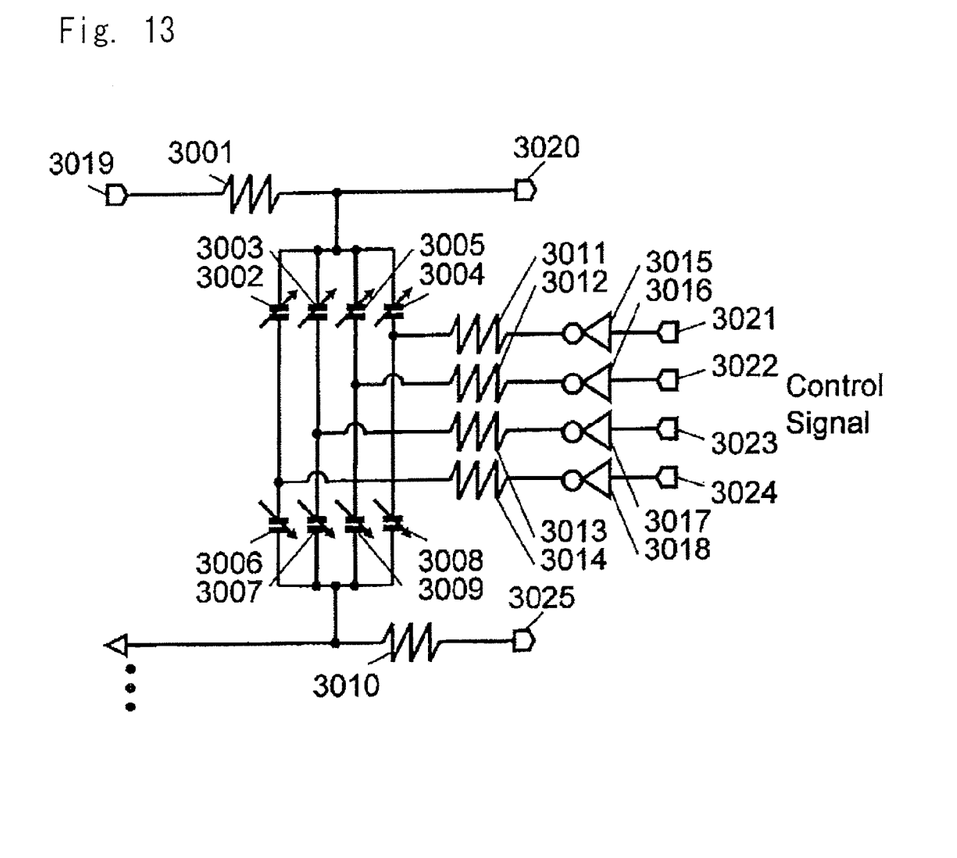
FIG. 13 is a view illustrating a specific circuit of the polyphase filter according to the second embodiment of the present invention.

Next, specific circuit of the polyphase filter is explained in detail with reference to the drawings. As shown in FIG. 13, a basic configuration of the polyphase filter includes resistive elements 3001 and 3010, and 3011 to 3014 and variable capacitive elements 3002 to 3009 and inverter amplifiers 3015 to 3018. Note that the polyphase filter is composed based on this basic configuration in a similar manner as the polyphase filter shown in FIGS. 10 to 12. Capacitance values of these variable capacitive elements are controlled by digital signals from control terminals 3021 to 3024. At this time, the variable capacitive elements are weighted by thermometer codes or binary codes.

Figure 17:
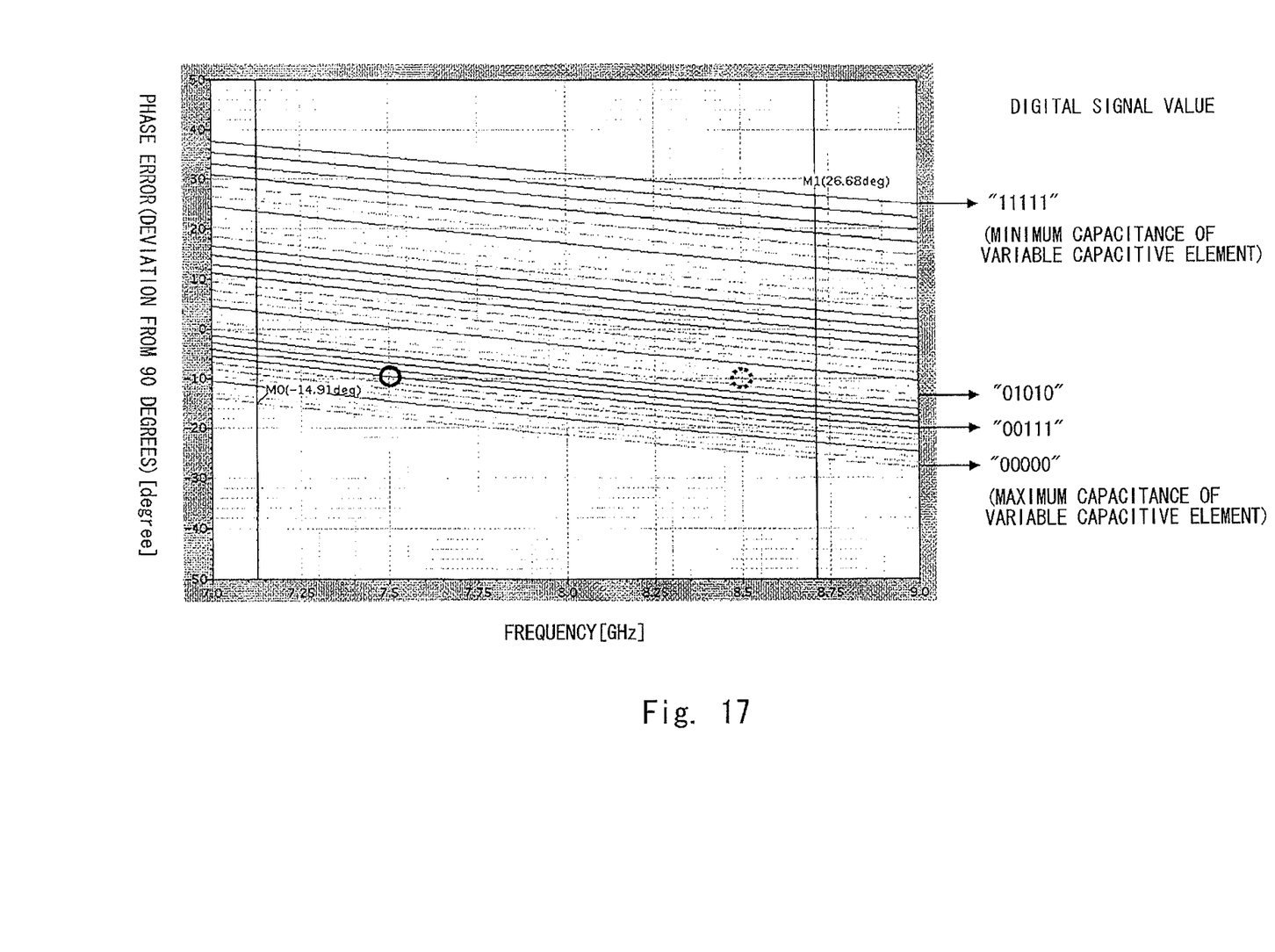
FIG. 17 is a graph illustrating an example of a phase error simulation result according to the second embodiment of the present invention.

Next, how the phase error is adjusted in the circuit configuration shown in FIG. 13 is explained with reference to an example shown in FIG. 17. FIG. 17 is an example of a phase error simulation result when sweeping the digital signal and changing the capacitance of the variable capacitive element from minimum to maximum in a one-stage polyphase filter. Note that in this example, the variable capacitive element is controlled by a digital signal of a five-bit binary code. At this time, the phase error can be minimized by setting the digital signal to "00111" in the case of the frequency of 7.5-GHz, and to "01010" in the case of the frequency of 8.5-GHz. This minimum phase error is improved by reducing the minimum unit capacitance (the capacitance varied by one bit) of the variable capacitive element. At this time, as the range of the adjustment frequency is narrowed with the same number of bits, it is required to increase the number of bits in order to maintain the range.

Next, an operation of the band adjustment device of the polyphase filter (band adjustment method of the polyphase filter) according to the second embodiment of the present invention is explained in detail with reference to the drawing.

The information of the amount of deviation of the phase or the amplitude between the IQ signals output from the polyphase filter, which is included in the output signal from the envelope detector, is converted into a digital signal by the band control digital signal generation circuit, and the element value composing the polyphase filter is changed.

As explained above, according to this embodiment, since the element value of the polyphase filter can be controlled by the digital signal, it is possible to reduce element value fluctuation, that is band fluctuation, of the polyphase filter due to noise, as compared to the case of controlling the element value by an analog signal. Moreover, a variable characteristic of a variable capacitive element in general is that the sensitivity is small when the controlled voltage is near High or Low, and High when the controlled voltage is in the middle between High and Low. This also reduces the band fluctuation caused by the noise.

Third Embodiment

Figure 3:
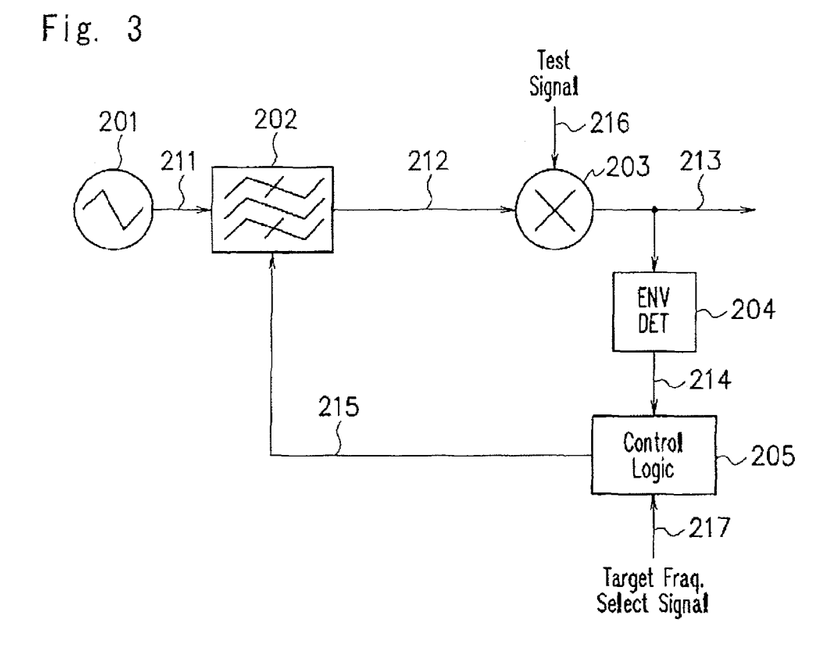
FIG. 3 is a block diagram illustrating a configuration of a band adjustment device of a polyphase filter according to a third embodiment of the present invention.

FIG. 3 is a block diagram showing a configuration of a band adjustment device of a polyphase filter according to a third embodiment of the present invention. The band adjustment device of the polyphase filter of this embodiment includes a voltage controlled oscillator (VCO) 201 that generates a differential clock signal, a polyphase filter 202 that receives the output from the VCO and generates an IQ signal, a mixer 203 that receives the output from the polyphase filter and a test signal, an envelope detection circuit (envelope detector) 204 that receives a mixer output, and a band control digital signal generation circuit 205 that receives the output from the envelope detector and a target frequency switching control signal.

Next, an operation of the band adjustment device of the polyphase filter (the band adjustment method of the polyphase filter) according to the third embodiment of the present invention is explained in detail with reference to the drawings.

Figure 14:
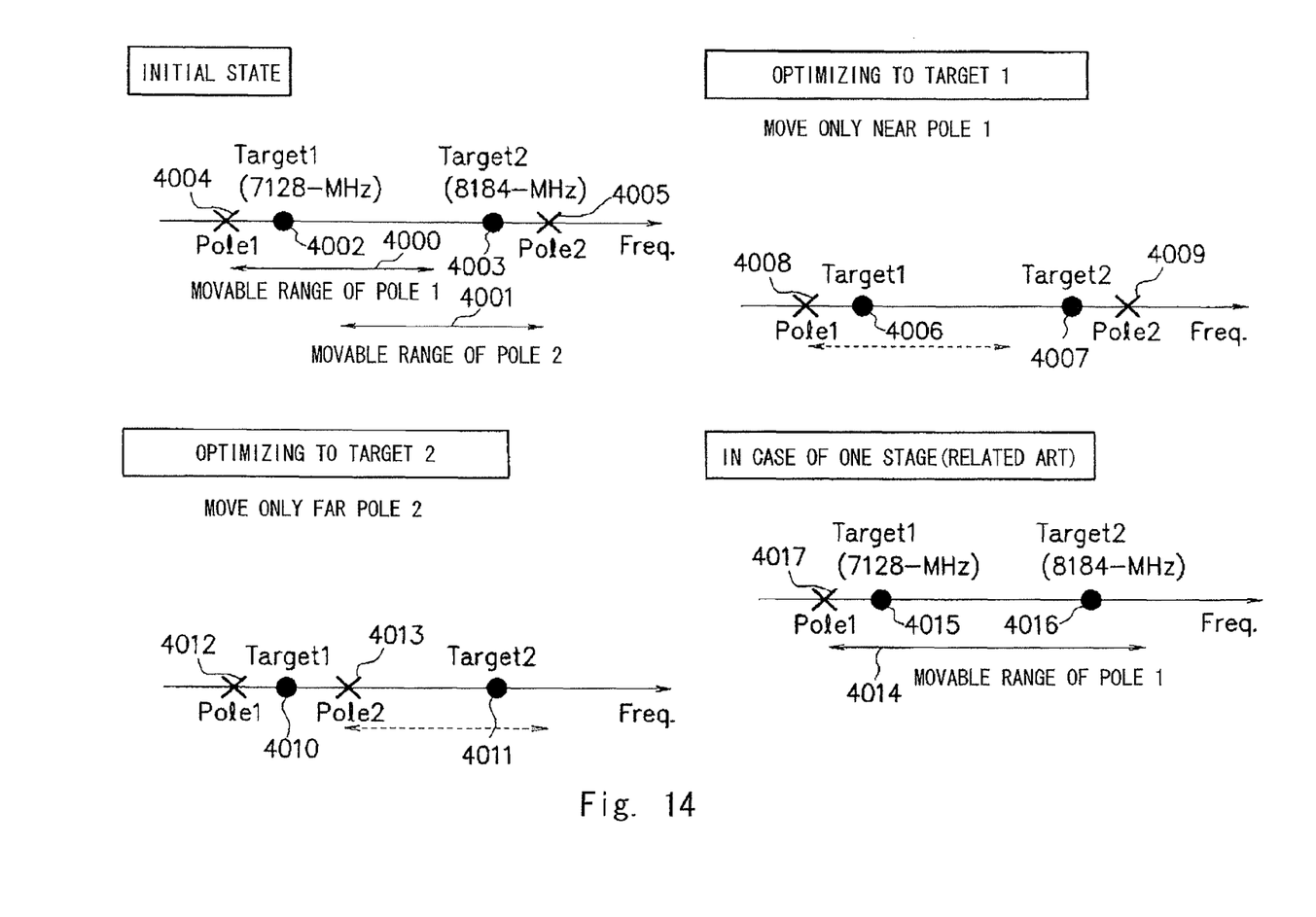
FIG. 14 is a view illustrating a specific operation of frequency adjustment according to the third embodiment of the present invention.

FIG. 14 is a view showing an adjustment operation of a pole frequency of the polyphase filter in the case of switching two request frequencies. At this time, the polyphase filter shall be configured to be two stages. In an initial state, a first pole frequency 4004 exists near a first target frequency 4002, whereas a second pole frequency 4005 exists near a second target frequency 4003. Note that this pole frequency is mainly determined by a time constant of a resistance value and a capacitance value of each stage which composes the polyphase filter. When adjusting the band of the polyphase filter to the first target frequency, firstly the far second pole frequency is not moved, but only the near first pole frequency is moved. Note that it is desirable to previously adjust the second pole frequency to be the farthest. Then, in response to input of the test signal to the mixer, the first pole frequency is searched, in which the amplitude or the phase error detected by the envelope detector becomes less than or equal to the desired value. At this time, it is desirable to specify the first pole frequency, leaving room for the band fluctuation caused by element value fluctuation associated with an environmental temperature change. After determining the first pole frequency in this way, the second pole frequency is searched in a similar manner in which the amplitude or the phase error becomes less than or equal to the desired value, while leaving the first pole frequency as it is. In the case of adjusting to the second target frequency of only one side, it will be the opposite operation. The signal to control how to move the pole frequency to be optimized is a control signal 217. Note that this configuration can be easily expanded for a configuration with two or more stages and two or more target frequencies.

Figure 15:
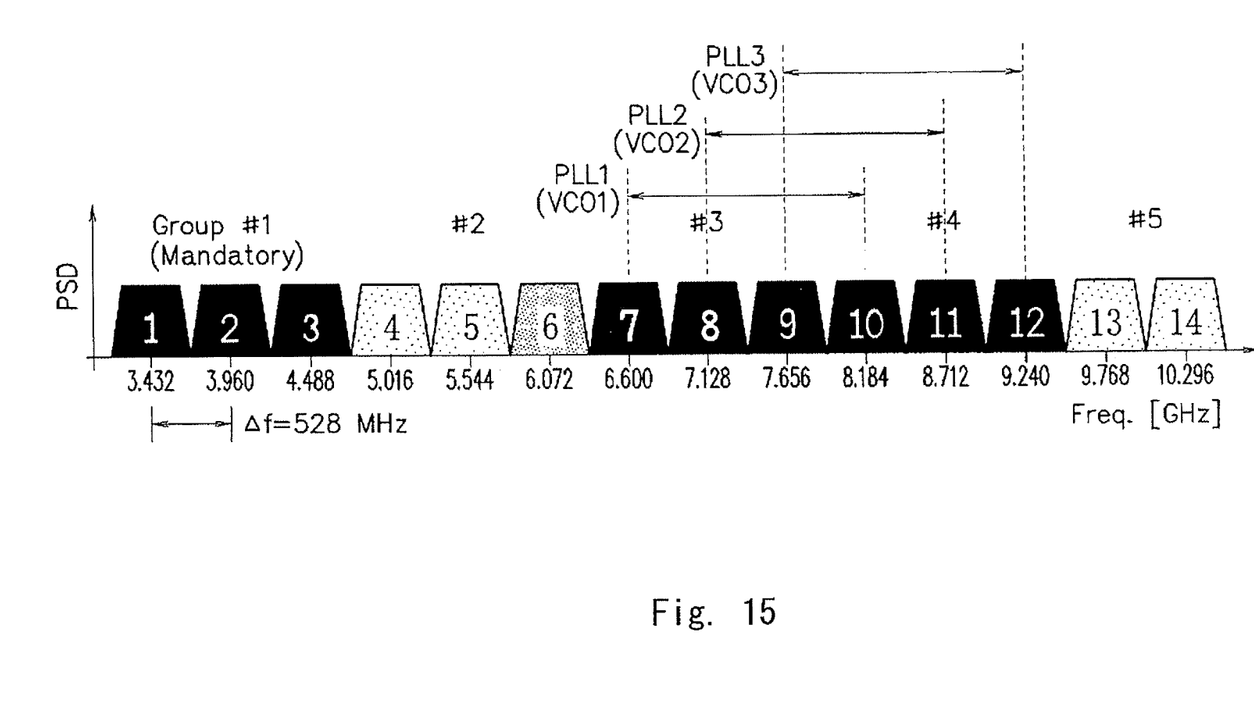
FIG. 15 is a view illustrating a specific application to UWB according to the third embodiment of the present invention.

As explained above, according to this embodiment, movable ranges 4000 and 4001 of the poles can be narrowed compared with a movable range 4014 of the pole in the case of the configuration of one-stage polyphase filter. In other words, the broadband can be adjusted in the variable fluctuation range in a variable fluctuation range with a few elements. Such a configuration is especially effective to generate an IQ signal of a broadband wireless transceiver like UWB (Ultra Wide Band) as shown in FIG. 15. Specifically, in order to generate an IQ signal of band groups 3 and 4 to frequency hop, this configuration is used to generate a highly accurate IQ signal at frequencies of 6600-MHz and 8184-MHz for the first VCO, 7128-MHz and 8712-MHz for the second VCO, and 7656-MHz and 9240-MHz for the third VCO. At this time, in the adjustment method of the polyphase filter according to the present invention, it is not necessary to operate at all times, thus the envelope detector can be shared between the first to the third VCOs.

Fourth Embodiment

Figure 4:
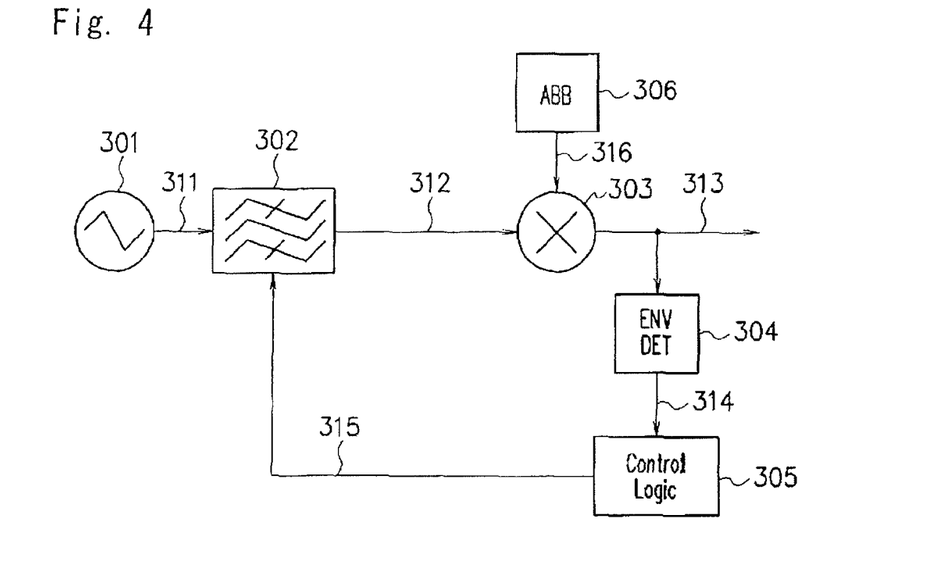
FIG. 4 is a block diagram illustrating a configuration of a band adjustment device of a polyphase filter according to a fourth embodiment of the present invention.

FIG. 4 is a block diagram showing a configuration of a band adjustment device of a polyphase filter according to a fourth embodiment of the present invention. The band adjustment device of the polyphase filter of this embodiment includes a voltage controlled oscillator (VCO) 301 that generates a differential clock signal, a polyphase filter 302 that receives the output from the VCO and generates an IQ signal, a mixer 303 that receives the output from the polyphase filter and a test signal, an envelope detection circuit (envelope detector) 304 that receives a mixer output, a band control digital signal generation circuit 305 that receives the output from the envelope detector, and an analog baseband circuit 306.

Next, an operation of the band adjustment device of the polyphase filter (band adjustment method of the polyphase filter) according to the fourth embodiment of the present invention is explained in detail with reference to the drawing.

As shown in FIG. 4, a test signal with an analog waveform is generated by the analog baseband circuit, and this test signal is input to the mixer.

As explained above, according to this embodiment, the analog baseband circuit can be commonly used for the test signal generation and the baseband signal generation.

Fifth Embodiment

Figure 5:
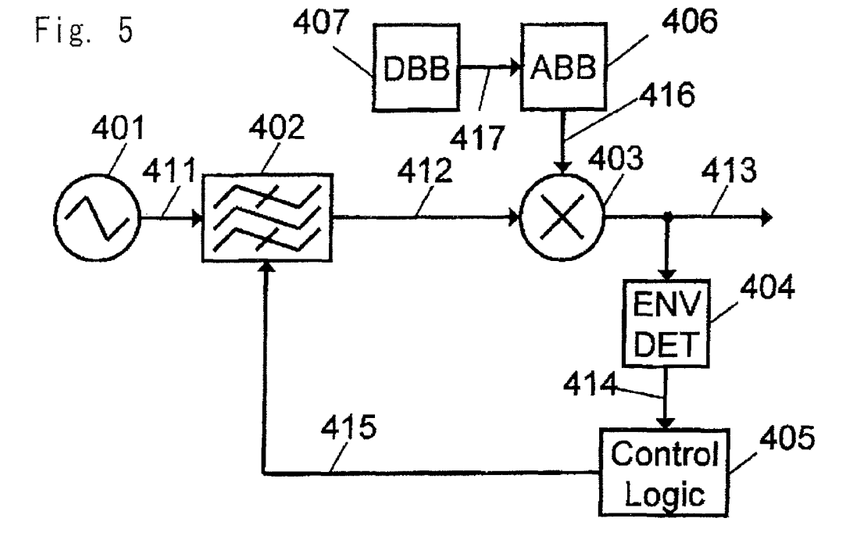
FIG. 5 is a block diagram illustrating a configuration of a band adjustment device of a polyphase filter according to a fifth embodiment of the present invention.

FIG. 5 is a block diagram showing a configuration of a band adjustment device of a polyphase filter according to a fifth embodiment of the present invention. The band adjustment device of the polyphase filter of this embodiment includes a voltage controlled oscillator (VCO) 401 that generates a differential clock signal, a polyphase filter 402 that receives the output from the VCO and generates an IQ signal, a mixer 403 that receives the output from the polyphase filter and a test signal, an envelope detection circuit (envelope detector) 404 that receives a mixer output, a band control digital signal generation circuit 405 that receives the output from the envelope detector, an analog baseband circuit 406, and a digital baseband circuit 407.

Next, an operation of the band adjustment device of the polyphase filter (band adjustment method of the polyphase filter) according to the fifth embodiment of the present invention is explained in detail with reference to the drawing.

As shown in FIG. 5, a test signal with a digital waveform is generated by the digital baseband circuit, and this test signal is input to the mixer via the analog baseband circuit 406.

As explained above, according to this embodiment, the digital baseband circuit can be commonly used for the test signal generation and the baseband signal generation. Further, the test signal becomes less susceptible to the influence of noise.

Sixth Embodiment

Figure 6:
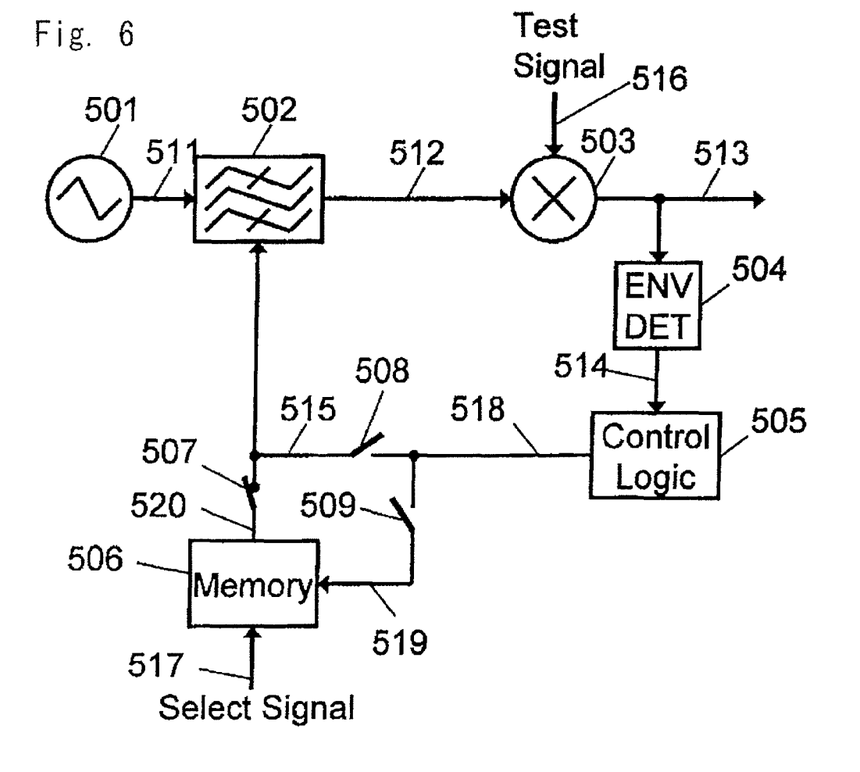
FIG. 6 is a block diagram illustrating a configuration of a band adjustment device of a polyphase filter according to a sixth embodiment of the present invention.

FIG. 6 is a block diagram showing a configuration of a band adjustment device of a polyphase filter according to a sixth embodiment of the present invention. The band adjustment device of the polyphase filter of this embodiment includes a voltage controlled oscillator (VCO) 501 that generates a differential clock signal, a polyphase filter 502 that receives the output from the VCO and generates an IQ signal, a mixer 503 that receives the output from the polyphase filter and a test signal, an envelope detection circuit (envelope detector) 504 that receives a mixer output, a band control digital signal generation circuit 505 that receives the output from the envelope detector, a memory circuit 506, and switches 507 to 509.

Next, an operation of the band adjustment device of the polyphase filter (band adjustment method of the polyphase filter) according to the sixth embodiment of the present invention is explained in detail with reference to the drawing.

As shown in FIG. 6, a digital control signal 518, which is optimal to the target frequency determined by the loop of the envelope detector, is stored to the memory circuit by turning on the switch 519. Optimal digital control signals to other target frequencies are stored to the memory circuit by the similar operations. After that, the switch 507 is turned on while the loop is stopped by turning off the switches 508 and 509, accumulated digital control is output from the memory circuit and the band adjustment of the polyphase filter is performed. Moreover, the optimal digital control signal to each target frequency is selected by a signal 517. At this time, the power of the envelope detector and the bandwidth control digital signal generation circuit is turned off.

As explained above, according to this embodiment, since the band is adjusted in an open loop, the band adjustment at a high speed can be possible. Moreover, the electric power of the envelope detector and the band control digital signal generation circuit can be reduced.

Seventh Embodiment

Figure 7:
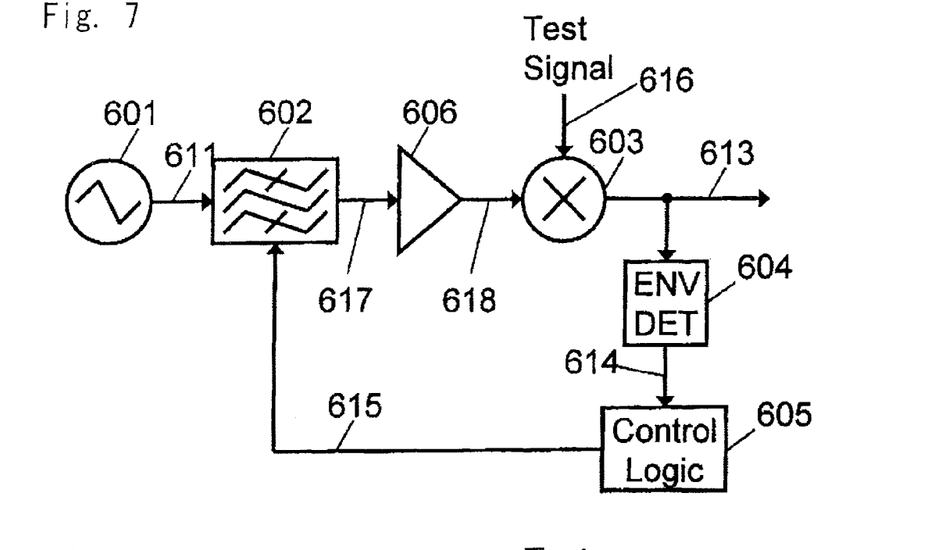
FIG. 7 is a block diagram illustrating a configuration of a band adjustment device of a polyphase filter according to a seventh embodiment of the present invention.

FIG. 7 is a block diagram showing a configuration of a band adjustment device of a polyphase filter according to a seventh embodiment of the present invention. The band adjustment device of the polyphase filter of this embodiment includes a voltage controlled oscillator (VCO) 601 that generates a differential clock signal, a polyphase filter 602 that receives the output from the VCO and generates an IQ signal, an amplifier 606 that receives the output from the polyphase filter, a mixer 603 that receives the output from the amplifier and a test signal, an envelope detection circuit (envelope detector) 604 that receives a mixer output, and a band control digital signal generation circuit 605 that receives the output from the envelope detector.

Next, an operation of the band adjustment device of the polyphase filter (band adjustment method of the polyphase filter) according to the seventh embodiment of the present invention is explained in detail with reference to the drawing.

As shown in FIG. 7, amplitude of the output signal from the polyphase filter is limited by the amplifier.

As explained above, according to this embodiment, such a configuration can reduce an amplitude error included in the output signal from the polyphase filter. Further, the attenuated amplitude can be amplified by passing through the polyphase filter.

Eighth Embodiment

Figure 8:
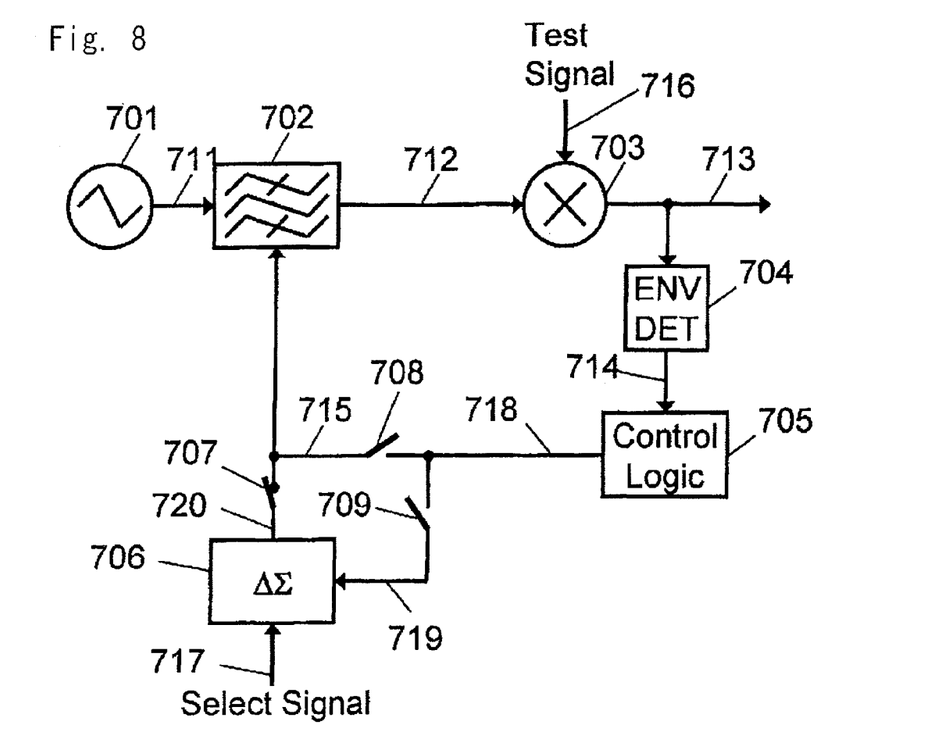
FIG. 8 is a block diagram illustrating a configuration of a band adjustment device of a polyphase filter according to a eighth embodiment of the present invention.

FIG. 8 is a block diagram showing a configuration of a band adjustment device of a polyphase filter according to an eighth embodiment of the present invention. The band adjustment device of the polyphase filter of this embodiment includes a voltage controlled oscillator (VCO) 701 that generates a differential clock signal, a polyphase filter 702 that receives the output from the VCO and generates an IQ signal, a mixer 703 that receives the output from the polyphase filter and a test signal, an envelope detection circuit (envelope detector) 704 that receives a mixer output, and a band control digital signal generation circuit 705 that receives the output from the envelope detector, a delta-sigma modulation circuit 706, and switches 707 to 709.

Next, an operation of the band adjustment device of the polyphase filter (band adjustment method of the polyphase filter) according to the eighth embodiment of the present invention is explained in detail with reference to the drawing.

As shown in FIG. 8, a band of the polyphase filter is adjusted by a delta-sigma modulated control signal 720.

As explained above, according to this embodiment, such a configuration can change to continuous adjustment from discrete adjustment for the band of the polyphase filter, and thereby achieving higher accurate band adjustment.

Ninth Embodiment

Figure 9:
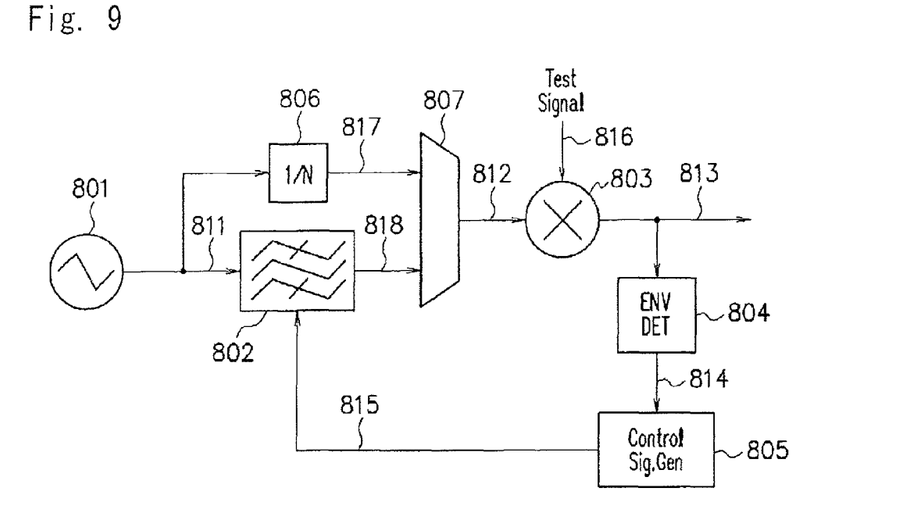
FIG. 9 is a block diagram illustrating a configuration of a band adjustment device of a polyphase filter according to a ninth embodiment of the present invention.

FIG. 9 is a block diagram showing a configuration of a band adjustment device of a polyphase filter according to a ninth embodiment of the present invention. The band adjustment device of the polyphase filter of this embodiment includes a voltage controlled oscillator (VCO) 801 that generates a differential clock signal, a polyphase filter 802 that receives the output from the VCO and generates an IQ signal, a frequency divider 806 that receives the output from the VCO, a selector 807 that switches the output from the polyphase filter and the output from the frequency divider to be output, a mixer 803 that receives the output from the selector and a test signal, an envelope detection circuit (envelope detector) 804 that receives a mixer output, and a band control digital signal generation circuit 805 that receives the output from the envelope detector.

Next, an operation of the band adjustment device of the polyphase filter (band adjustment method of the polyphase filter) according to the ninth embodiment of the present invention is described in detail with reference to the drawing.

As shown in FIG. 9, an IQ signal with the same frequency as the VCO is generated by the polyphase filter, whereas an IQ signal with 1/N frequency of the VCO is generated by the frequency divider and input to the mixer. At this time, when the former IQ signal is selected, amplitude or phase deviation is corrected by the loop using the envelope detector, whereas when the latter IQ signal is selected, the loop is stopped.

As explained above, according to this embodiment, such a configuration can increase the bandwidth of the IQ signal input to the mixer. Further, when using the IQ signal by the side of the frequency divider, the electric power on the polyphase filter side can be reduced. Such a configuration is useful in the case of generating the IQ signal of a UWB first band group by the frequency divider side, and generating the IQ signal of the third to the fourth band groups by the polyphase filter side.

Although each embodiment of the present invention was described so far, the present invention is not limited to the above each embodiment. However various modification can be made without departing from the scope of the present invention. Moreover, the configuration and operation of the above each embodiment can be arbitrarily combined.

For example, the abovementioned operation in each embodiment can be carried out by hardware, software, or composite configuration of both.

To execute the process by software, a program recorded with a process sequence may be installed and executed on a memory in the computer, which is incorporated in dedicated hardware. Alternatively, a program may be installed and executed on a general computer that can execute various processes.

For example, the program can be recorded on a hard disk or a ROM (Read Only Memory) in advance. Alternatively, the program may be temporarily or permanently stored (recorded) on a removable recording medium such as a CD-ROM (Compact Disc Read Only Memory), a MO (Magneto optical) disc, a DVD (Digital Versatile Disc), a magnetic disk, or a semiconductor memory. Such a removable recording medium can be provided as a so-called software package.

Note that the program may be wirelessly transferred to a computer from a download side other than installing the program on a computer from the abovementioned removable recording media. Alternatively, the program may be transferred on wires to a computer via a network such as LAN (Local Area Network) and the Internet. The computer receives the transferred program and can install it on an embedded recording medium such as a hard disc.

Moreover, it is possible to build to execute in parallel or individually depending on the processing capability of the device to execute the process or as necessary, not only executing in a time-series manner according to the process operation explained in the above embodiments.

This application claims priority of Japanese Patent Application No. 2008-130676 filed May 19, 2008, the entire disclosure of which is hereby incorporated by reference herein.

EXPLANATION OF REFERENCE 1, 101, 201, 301, 401, 501, 601, 701, and 801 VOLTAGE CONTROLLED OSCILLATOR (VCO)
2, 102, 202, 302, 402, 502, 602, 702, and 802 POLYPHASE FILTER
3, 103, 203, 303, 403, 503, 603, 703, and 803 MIXER
4, 104, 204, 304, 404, 504, 604, 704, and 804 ENVELOPE DETECTION CIRCUIT (ENVELOPE DETECTOR)
5 and 805 BAND CONTROL SIGNAL GENERATION CIRCUIT
11, 111, 211, 311, 411, 511, 611, 711, and 811 OUTPUT SIGNAL FROM VCO
12, 112, 212, 312, 412, 512, 617, 712, and 818 OUTPUT SIGNAL FROM POLYPHASE FILTER
13, 113, 213, 313, 413, 513, 613, 713, and 813 OUTPUT SIGNAL FROM MIXER
14, 114, 214, 314, 414, 514, 614, 714, and 814 OUTPUT SIGNAL FROM ENVELOPE DETECTOR
15 and 815 OUTPUT SIGNAL FROM BAND CONTROL SIGNAL GENERATION CIRCUIT
16, 116, 216, 316, 416, 516, 616, 716, and 816 INPUT SIGNAL TO MIXER
105, 205, 305, 405, 505, 605, and 705 BAND CONTROL DIGITAL SIGNAL GENERATION CIRCUIT
115, 215, 315, 415, 518, 615, and 718 OUTPUT SIGNAL FROM BAND CONTROL DIGITAL SIGNAL GENERATION CIRCUIT
217 CONTROL SIGNAL OF BANDWIDTH DIGITAL SIGNAL GENERATION CIRCUIT
306 and 406 ANALOG BASEBAND CIRCUIT
407 DIGITAL BASEBAND CIRCUIT
506 MEMORY CIRCUIT
507 and 707 FIRST SWITCH
508 and 708 SECOND SWITCH
509 and 709 THIRD SWITCH
515 and 715 CONTROL SIGNAL FROM POLYPHASE FILTER
517 CONTROL SIGNAL OF MEMORY CIRCUIT
519 INPUT SIGNAL TO MEMORY CIRCUIT
520 OUTPUT SIGNAL FROM MEMORY CIRCUIT
606 AMPLIFIER
618 OUTPUT SIGNAL FROM AMPLIFIER
706 DELTA-SIGMA MODULATION CIRCUIT
717 CONTROL SIGNAL OF DELTA-SIGMA MODULATION CIRCUIT
719 INPUT SIGNAL TO DELTA-SIGMA MODULATION CIRCUIT
720 OUTPUT SIGNAL FROM DELTA-SIGMA MODULATION CIRCUIT
806 FREQUENCY DIVIDER
807 SELECTOR
812 OUTPUT SIGNAL FROM SELECTOR
817 OUTPUT SIGNAL FROM FREQUENCY DIVIDER
2001, 2201, and 3002 FIRST VARIABLE CAPACITIVE ELEMENT
2002, 2202, and 3003 SECOND VARIABLE CAPACITIVE ELEMENT
2003, 2203, and 3004 THIRD VARIABLE CAPACITIVE ELEMENT
2004, 2204, and 3005 FOURTH VARIABLE CAPACITIVE ELEMENT
2005, 2205, and 3006 FIFTH VARIABLE CAPACITIVE ELEMENT
2006, 2206, and 3007 SIXTH VARIABLE CAPACITIVE ELEMENT
2007, 2207, and 3008 SEVENTH VARIABLE CAPACITIVE ELEMENT
2008, 2208, and 3009 EIGHTH VARIABLE CAPACITIVE ELEMENT
2009, 2209, and 3001 FIRST RESISTIVE ELEMENT
2010, 2210, and 3010 SECOND RESISTIVE ELEMENT
2011, 2211, and 3011 THIRD RESISTIVE ELEMENT
2012, 2212, and 3012 FOURTH RESISTIVE ELEMENT
2013, 2213, and 3013 FIFTH RESISTIVE ELEMENT
2014, 2214, and 3014 SIXTH RESISTIVE ELEMENT 2015 and 2215 SEVENTH RESISTIVE ELEMENT
2016 and 2216 EIGHTH RESISTIVE ELEMENT
2017, 2117, and 2217 FIRST INPUT TERMINAL
2018, 2118, and 2218 SECOND INPUT TERMINAL
2019, 2119, 2219, and 3020 FIRST OUTPUT TERMINAL
2020, 2120, 2220, and 3025 SECOND OUTPUT TERMINAL
2021, 2121, and 2221 THIRD OUTPUT TERMINAL
2022, 2122, and 2222 FOURTH OUTPUT TERMINAL
2023, 2123, 2223, and 3021 FIRST CONTROL TERMINAL
2024, 2124, 2224, and 3022 SECOND CONTROL TERMINAL
2025, 2125, 2225, and 3023 THIRD CONTROL TERMINAL
2026, 2126, 2226, and 3024 FOURTH CONTROL TERMINAL
2027, 2127, and 2227 FIFTH CONTROL TERMINAL
2028, 2128, and 2228 SIXTH CONTROL TERMINAL
2029, 2129, and 2229 SEVENTH CONTROL TERMINAL
2030, 2130, and 2230 EIGHTH CONTROL TERMINAL
2101 FIRST CAPACITIVE ELEMENT
2102 SECOND CAPACITIVE ELEMENT
2103 THIRD CAPACITIVE ELEMENT
2104 FOURTH CAPACITIVE ELEMENT
2105 FIFTH CAPACITIVE ELEMENT
2106 SIXTH CAPACITIVE ELEMENT
2107 SEVENTH CAPACITIVE ELEMENT
2108 EIGHTH CAPACITIVE ELEMENT
2109 FIRST VARIABLE RESISTIVE ELEMENT
2110 SECOND VARIABLE RESISTIVE ELEMENT
2111 THIRD VARIABLE RESISTIVE ELEMENT
2112 FOURTH VARIABLE RESISTIVE ELEMENT
2113 FIFTH VARIABLE RESISTIVE ELEMENT
2114 SIXTH VARIABLE RESISTIVE ELEMENT
2115 SEVENTH VARIABLE RESISTIVE ELEMENT
2116 EIGHTH VARIABLE RESISTIVE ELEMENT
3015 FIRST INVERTER AMPLIFIER
3016 SECOND INVERTER AMPLIFIER
3017 THIRD INVERTER AMPLIFIER
3018 FOURTH INVERTER AMPLIFIER
3019 INPUT TERMINAL
4000 FIRST POLE MOVABLE FREQUENCY RANGE
4001 SECOND POLARITY POSITIVE MOVABLE FREQUENCY RANGE
4002 FIRST TARGET FREQUENCY
4003 SECOND TARGET FREQUENCY
4004 FIRST POLE FREQUENCY
4005 SECOND POLE FREQUENCY
4006 FIRST TARGET FREQUENCY
4007 SECOND TARGET FREQUENCY
4008 FIRST POLE FREQUENCY
4009 SECOND POLE FREQUENCY
4010 FIRST TARGET FREQUENCY
4011 SECOND TARGET FREQUENCY
4012 FIRST POLE FREQUENCY
4013 SECOND POLE FREQUENCY
4014 FIRST POLE MOVABLE FREQUENCY RANGE
4015 FIRST TARGET FREQUENCY
4016 SECOND TARGET FREQUENCY
4017 FIRST POLE FREQUENCY
5001 VOLTAGE CONTROLLED OSCILLATOR (VCO)
5002 POLYPHASE FILTER
5003 MIXER
5004 PHASE COMPARATOR
5005 PHASE-TO-CONTROLLED VOLTAGE CONVERTER
5010 OUTPUT SIGNAL FROM VCO
5011 OUTPUT SIGNAL FROM POLYPHASE FILTER
5012 OUTPUT SIGNAL FROM PHASE COMPARATOR
5013 OUTPUT SIGNAL FROM PHASE-TO-CONTROLLED VOLTAGE CONVERTER
5014 OUTPUT SIGNAL FROM MIXER

The invention claimed is:

1. A band adjustment device of a polyphase filter comprising:
a voltage controlled oscillator that generates a clock signal;
a polyphase filter that receives the clock signal output from the voltage controlled oscillator and outputs a four-phase signal;
a mixer that receives the four-phase signal output from the polyphase filter and an external test signal;
an envelope detection circuit that receives a signal output from the mixer; and
a band control signal generation circuit that receives a signal output from the envelope detection circuit and generates a band control signal for controlling a band of the polyphase filter.

2. The band adjustment device of the polyphase filter according to claim 1, wherein the band of the polyphase filter is adjusted by a variable capacitive element.

3. The band adjustment device of the polyphase filter according to claim 1, wherein the band of the polyphase filter is adjusted by a variable resistive element.

4. The band adjustment device of the polyphase filter according to claim 1, wherein the clock signal output from the voltage controlled oscillator includes differential (two-phase).

5. The band adjustment device of the polyphase filter according to claim 1, wherein the band control signal generation circuit generates a digital signal as the band control signal.

6. The band adjustment device of the polyphase filter according to claim 5, wherein the band of the polyphase filter is adjusted by the digital signal applied to a variable capacitive element.

7. The band adjustment device of the polyphase filter according to claim 6, wherein the variable capacitive element is composed of the variable capacitive element weighted by a plurality of binary codes.

8. The band adjustment device of the polyphase filter according to claim 6, wherein the variable capacitive element is composed of the variable capacitive element weighted by a plurality of thermometer codes.

9. The band adjustment device of the polyphase filter according to claim 1, wherein the band control signal generation circuit generates a digital signal as the band control signal and switches an algorithm for generating the digital signal by an external control signal according to a plurality of target frequencies of the polyphase filter.

10. The band adjustment device of the polyphase filter according to claim 9, wherein the algorithm searches for a variable element value that mainly determines a pole frequency of the far polyphase filer after searching for a variable element value that mainly determines a pole frequency of the polyphase filer existing near the target frequency while the element to control is switched according to the target frequency.

11. The band adjustment device of the polyphase filter according to claim 1, further comprising an analog baseband circuit that generates a test signal with an analog waveform and inputs the test signal to the mixer.

12. The band adjustment device of the polyphase filter according to claim 1, further comprising a digital baseband circuit that generates a test signal with a digital waveform and inputs the test signal to the mixer.

13. The band adjustment device of the polyphase filter according to claim 1, further comprising:
   a memory circuit that stores the band control signal generated by the band control signal generation circuit; and
   a switch that switches output of the band control signal generation circuit and output of the memory circuit.

14. The band adjustment device of the polyphase filter according to claim 13, wherein the memory circuit stores the band control signal for a plurality of target frequencies.

15. The band adjustment device of the polyphase filter according to claim 13, wherein power of the envelope detection circuit and the band control signal generation circuit is blocked while data of the memory circuit is read out.

16. The band adjustment device of the polyphase filter according to claim 1, further comprising an amplifier that inputs the signal output from the polyphase filter and limits amplitude,
   wherein the mixer receives a signal output from the amplifier along with the external test signal.

17. The band adjustment device of the polyphase filter according to claim 1, further comprising a delta-sigma modulation circuit that performs delta-sigma modulation to the band control signal, the band control signal being generated by the band control signal generation circuit.

18. The band adjustment device of the polyphase filter according to claim 1, further comprising:
   a frequency divider circuit that receives the clock signal output from the voltage controlled oscillator and outputs a divided four-phase signal; and
   a selector that selects the four-phase signal output from the polyphase filter or the four-phase signal output from the frequency divider circuit,
   wherein the mixer receives the signal selected by the selector along with the external test signal.

19. A band adjustment method of a polyphase filer comprising:
   a step performed by a voltage controlled oscillator of generating a clock signal;
   a step performed by a polyphase filter of receiving the clock signal output from the voltage controlled oscillator and outputting a four-phase signal;
   a step performed by a mixer of receiving the four-phase signal output from the polyphase filer and an external test signal;
   a step performed by an envelope detection circuit of receiving a signal output from the mixer; and
   a step performed by a band control signal generation circuit of receiving a signal output from the envelope detection circuit and generating a band control signal that controls a band of the polyphase filter.

20. The band adjustment method of the polyphase filter according to claim 19, wherein a digital signal is generated as the band control signal.

21. The band adjustment method of the polyphase filter according to claim 19, further comprising a step of generating the digital signal as the band control signal and switching an algorithm of generating the digital signal by an external control signal according to a plurality of target frequencies of the polyphase filter.

22. the band adjustment method of the polyphase filter according to claim 19, further comprising a step of generating a test signal of an analog waveform and inputting the test signal to the mixer.

23. The band adjustment method of the polyphase filter according to claim 19, further comprising a step of generating a test signal of a digital waveform and inputting the test signal to the mixer.

24. The band adjustment method of the polyphase filter according to claim 19, further comprising:
   a step of storing the band control signal generated by the band control signal generation circuit to a memory circuit; and
   a step of switching output from the band control signal generation circuit and output from the memory circuit.

25. The band adjustment method of the polyphase filter according to claim 19, further comprising a step of receiving the signal output from the polyphase filter to limit amplitude, and inputting the signal together with the external test signal into the mixer.

26. The band adjustment method of the polyphase filter according to claim 19, further comprising a step of delta-sigma modulating the band control signal generated by the band control signal generation circuit.

27. The band adjustment method of the polyphase filter according to claim 19, further comprising:
   a step performed by the frequency divider circuit of receiving the clock signal output from the voltage controlled oscillator and outputting a divided four-phase signal; and
   a step of selecting the four-phase signal output from the polyphase filter or the four-phase signal output from the frequency divider circuit and inputting the four-phase signal together with the external test signal to the mixer.

* * * * *